(12) United States Patent
Han et al.

(10) Patent No.: US 7,462,871 B2
(45) Date of Patent: Dec. 9, 2008

(54) SIDE-VIEW LIGHT EMITTING DIODE HAVING PROTECTIVE DEVICE

(75) Inventors: Kyung Taeg Han, Kyungki-do (KR); Myoung Soo Choi, Seoul (KR); Seon Goo Lee, Kyungki-do (KR); Jong Uk Park, Kyungki-do (KR); Chang Wook Kim, Kyungki-do (KR)

(73) Assignee: Samsung Electro-Mechanics Co., Ltd., Kyoungki-Do (KR)

( * ) Notice: Subject to any disclaimer, the term of this patent is extended or adjusted under 35 U.S.C. 154(b) by 234 days.

(21) Appl. No.: 11/497,232

(22) Filed: Aug. 2, 2006

(65) Prior Publication Data
US 2007/0029564 A1 Feb. 8, 2007

(30) Foreign Application Priority Data
Aug. 2, 2005 (KR) .................. 10-2005-0070806

(51) Int. Cl.
*H01L 27/15* (2006.01)
(52) U.S. Cl. .............. 257/81; 257/918; 257/E31.099; 257/E33.059; 257/E51.018
(58) Field of Classification Search .............. 257/13, 257/80, 81, 82, 100, 106, 918, E31.099, E33.059, 257/E51.018, E51.02; 438/22, 47, 69
See application file for complete search history.

(56) References Cited

U.S. PATENT DOCUMENTS
7,176,623 B2 * 2/2007 Nitta et al. .................. 313/512

* cited by examiner

*Primary Examiner*—Quoc D Hoang
(74) *Attorney, Agent, or Firm*—McDermott Will & Emery LLP

(57) ABSTRACT

In a side view LED, elongated first and second lead frames each have a finger extending therefrom. The finger of the first lead frame is disposed in parallel with that of the second lead frame. An LED chip and a protective device are mounted on mounting areas of the first and second lead frames, respectively and electrically connected to the first and second lead frames. A package body houses the first and second lead frames to form first and second opened areas. The first opened area is externally opened around the LED chip, the second opened area is externally opened around the protective device, and the partition wall is formed therebetween. First and second encapsulants are provided to the first and second opened areas, respectively to encapsulate the LED chip and protective device, respectively. At least the first encapsulant is transparent.

10 Claims, 10 Drawing Sheets

SIDE-VIEW LIGHT EMITTING DIODE HAVING PROTECTIVE DEVICE

CLAIM OF PRIORITY

This application claims the benefit of Korean Patent Application No. 2005-70806 filed on Aug. 2, 2005 in the Korean Intellectual Property Office, the disclosure of which is incorporated herein by reference.

BACKGROUND OF THE INVENTION

1. Field of the Invention

The present invention relates to a side view Light Emitting Diode (LED) including a protective device. More particularly, the present invention relates to a side view LED which has a partition wall formed between an LED chip and a protective device to prevent light absorption by the protective device, and is designed to improve electrical connections between the devices and lead frames.

2. Description of the Related Art

A small Liquid Crystal Device (LCD) used in mobile phones, Personal Digital Assistants (PDAs) and the like employs a side view Light Emitting Diode (LED) as a light source for its back light device. Such a side view LED is typically mounted in the backlight device as shown in FIG. 1.

Referring to FIG. 1, the backlight device 50 has a flat light guide plate 54 formed on a substrate 52. Also, a plurality of side-view LEDs 1 (only one LED illustrated) are arrayed on a side of the light guide pate 54. Light L incident into the light guide plate 54 from the LEDs is reflected upward by a reflective sheet 56 or microdot patterns formed on the light guide plate 54. Then the light L exits from the light guide plate 54 to provide a backlight to an LCD panel 58 over the light guide panel 54.

The LED is purportedly susceptible to static electricity, inverse voltage or over voltage. Especially, the side view LED needs to be extremely thin and accordingly an LED chip mounted is downscaled. This renders the LED greatly affected by undesired effects of current/voltage so that it is imperative to prevent them.

To this end, a voltage regulation diode is provided to the LED. That is, the voltage regulation diode is connected to the LED chip in parallel to effectively counter static electricity. Preferably, the voltage regulation diode is exemplified by a Zener diode.

Then, a detailed explanation will be given about a conventional side view LED having a Zener diode mounted therein with reference to FIGS. 2 and 3.

FIG. 2 is a front elevation view illustrating the side view LED having the Zener diode mounted therein according to the prior art. FIG. 3 is a cross-sectional view cut along the line 3-3 of FIG. 2.

As shown in FIGS. 2 and 3, the conventional LED 1 includes a package body 10, a pair of leads 20 and 22 spaced apart from each other at a predetermined gap and an LED chip 30 mounted on the lead 20.

The LED chip 30 is connected to the leads 20 and 22 via wires 32 and encapsulated by a transparent encapsulant 14 provided into a cup-shaped concave 12 therearound.

Meanwhile, a Zener diode 40 is mounted on the lead 22 and connected thereto via a wire 34. In this fashion, the Zener diode 40 is connected to the LED chip 30 in parallel, thereby protecting the LED chip 30 from static electricity, inverse voltage or over voltage.

The Zener diode 40, which belongs to a semiconductor PN junction diode, is structured such that it operates in a breakdown area of the PN junction. Thus the Zener diode 40 is chiefly used for voltage regulation or to ensure a constant voltage. The Zener diode 40 obtains a predetermined voltage via a zener recovery phenomenon. Also, the Zener diode 40 operates at a current of 10 mA when having a p-n junction of silicon and may produce a constant voltage of 3 to 12V depending on its type.

However, in the conventional LED 1, the Zener diode 40 is coplanarly disposed with the LED chip 30 in parallel so that light generated from the LED chip is absorbed or scattered by the Zener diode 40, thereby degrading light emitting efficiency of the LED 1.

Also, with the LED chip 30 and Zener diode 40 disposed in the narrow concave 12, the wires 32 and 34 should be disposed at a predetermined gap so that they do not contact one another. This requires a meticulous and deliberate process and accordingly undermines efficiency in fabricating the LED.

SUMMARY OF THE INVENTION

The present invention has been made to solve the foregoing problems of the prior art and therefore an object according to certain embodiments of the present invention is to provide a side view LED which has a partition wall formed between an LED chip and a protective device to prevent light absorption by the protective device, and is designed to improve electrical connections between the devices and lead frames.

Another object according to certain embodiments of the invention is to provide a side view LED which reduces a height of or limits a width of a partition wall disposed between an LED chip and a protective device to prevent light absorption by the protective device, thereby ensuring efficiency of the partition wall.

According to an aspect of the invention for realizing the object, there is provided a side view light emitting diode comprising: an elongated first lead frame having a finger extending therefrom; an elongated second lead frame with a narrow width and a long length having a finger disposed in parallel with the finger of the first lead frame, the second lead frame disposed next to the first lead frame at a predetermined gap along a length direction; a light emitting diode chip mounted on a mounting area of the first lead frame and electrically connected to the first and second lead frames; a protective device mounted on a mounting area of the second lead frame in parallel with the light emitting diode chip and electrically connected to the first and second lead frames to protect the light emitting diode chip from electrical abnormality, the mounting area of the second lead frame facing the same direction as the mounting area of the first lead frame; a package body housing the first and second lead frames to form a first opened area externally opened around the light emitting diode chip and a second opened area externally opened around the protective device, the package body having a partition wall formed across the fingers of the first and second lead frames and between the first and second opened areas to block light from the light emitting diode chip from entering the second opened area; and a first encapsulant provided to the first opened area of the package body to protect the LED chip; a second encapsulant provided to the second opened area of the package body to protect the protective device, wherein at least the first encapsulant is transparent.

In the side view LED of the invention, a distal end of the partition wall is coplanar with an outer surface of the transparent first encapuslant. Preferably, the second encapsulant is separate from the first encapsulant. Preferably, the second encapsulant comprises one selected from a group consisting of a transparent material, a semitransparent material and an opaque material.

In the side view LED of the invention, the partition wall partially separates the first opened area from the second opened area. Preferably, a distal end of the partition wall is disposed below an outer surface of the transparent encapsulant. Preferably, a portion of the partition wall is separated from a sidewall of the package body surrounding the first and second opened areas. Also, preferably, the first and second encapsulants are integrally formed of a transparent material and the transparent encapsulant contains an ultraviolet ray absorbent or a fluorescent material for converting short-wavelength light into multi-wavelength light. In addition, in the side view LED of the invention, the transparent first encapsulant contains an ultraviolet absorbent or a fluorescent material for converting short-wavelength light into multi-wavelength light.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Preferred embodiments of the present invention will now be described in detail with reference to the accompanying drawings.

Figure 1:
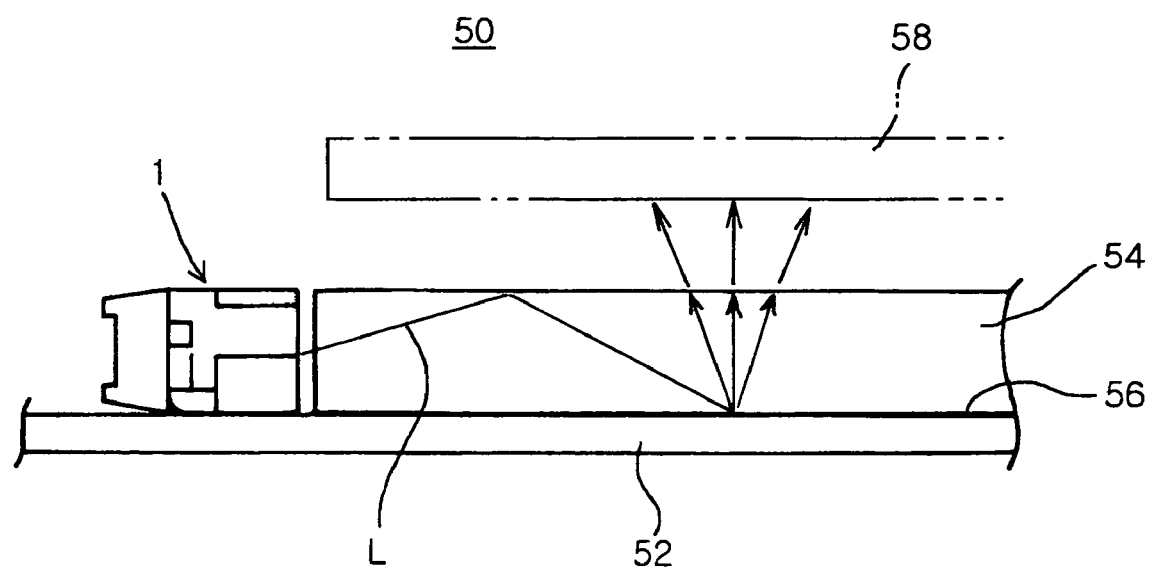
FIG. 1 is a side cross-sectional view illustrating a backlight device employing a side view LED according to the prior art.
Figure 2:
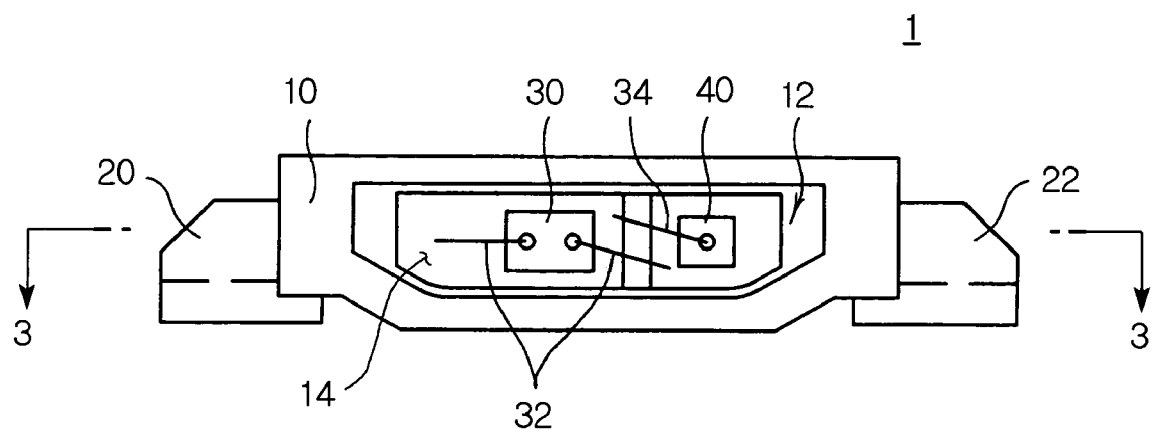
FIG. 2 is a front elevation view illustrating a side view LED having a Zener diode mounted therein according to the prior art.
Figure 3:
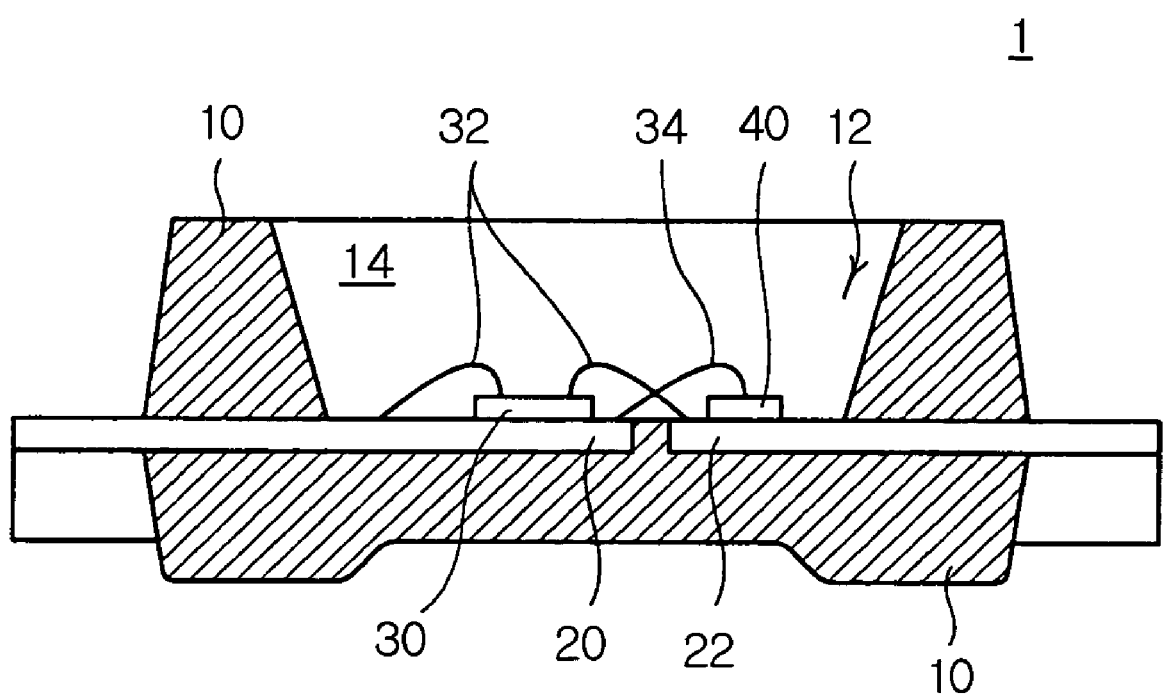
FIG. 3 is a cross-sectional view cut along the line 3-3 of FIG. 2.
Figure 4:
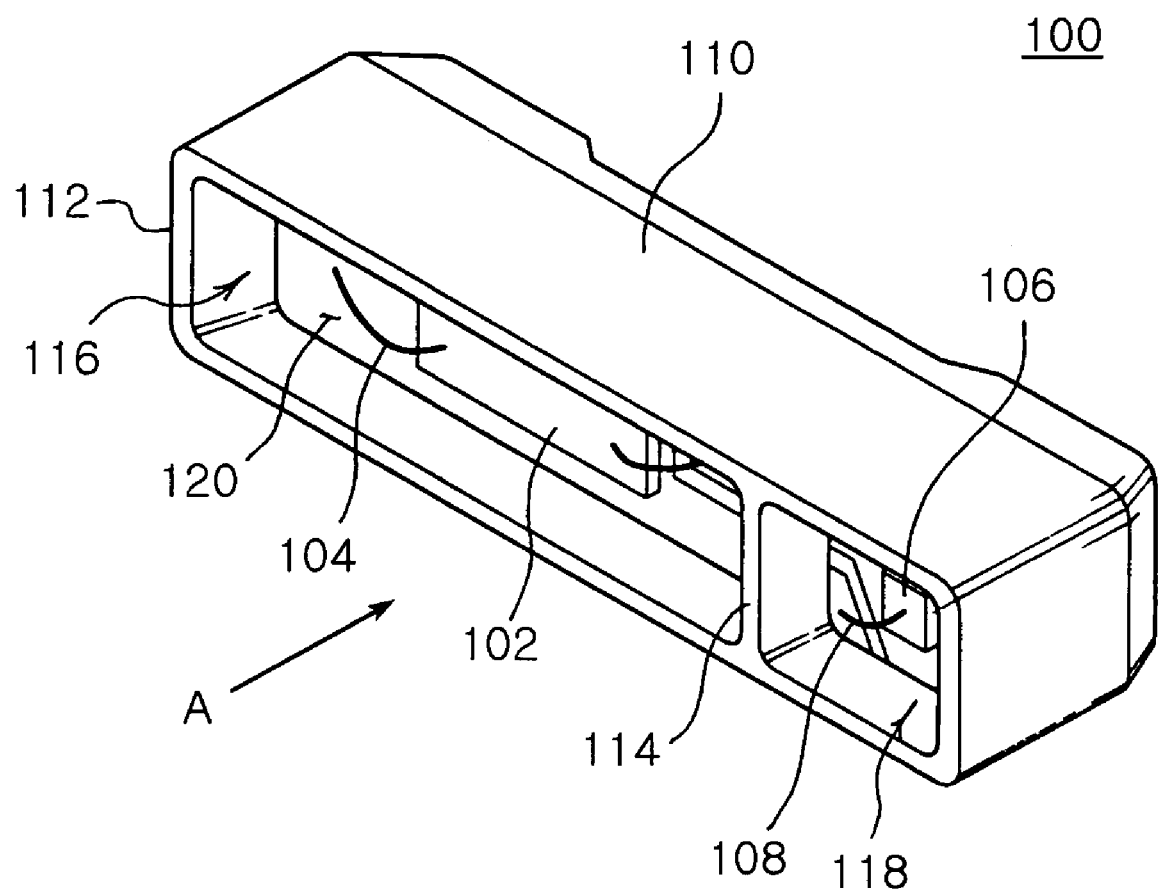
FIG. 4 is a perspective view illustrating a side view LED according to a preferred embodiment of the invention.
Figure 5:
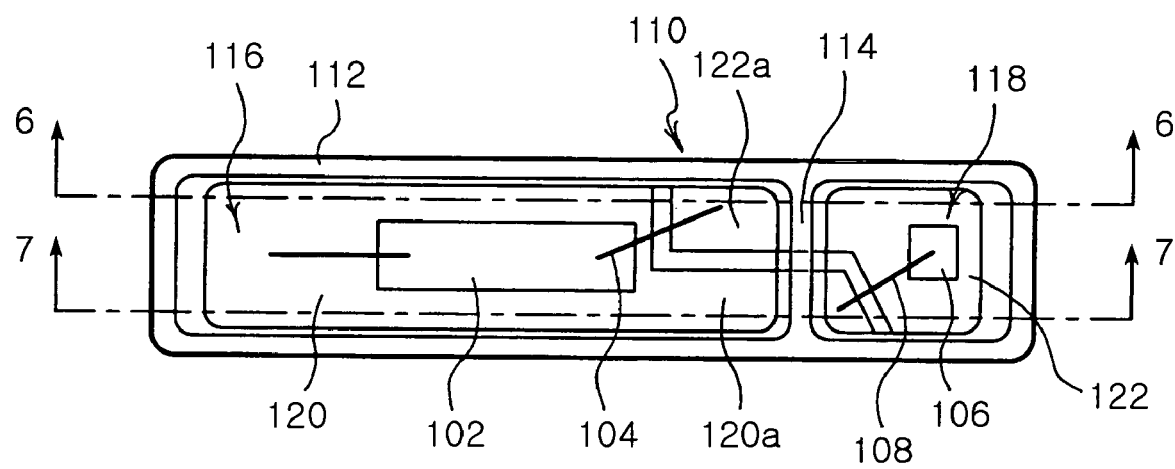
FIG. 5 is a front elevation view illustrating the side view LED of FIG. 4 seen along an arrow A direction.
Figure 6:
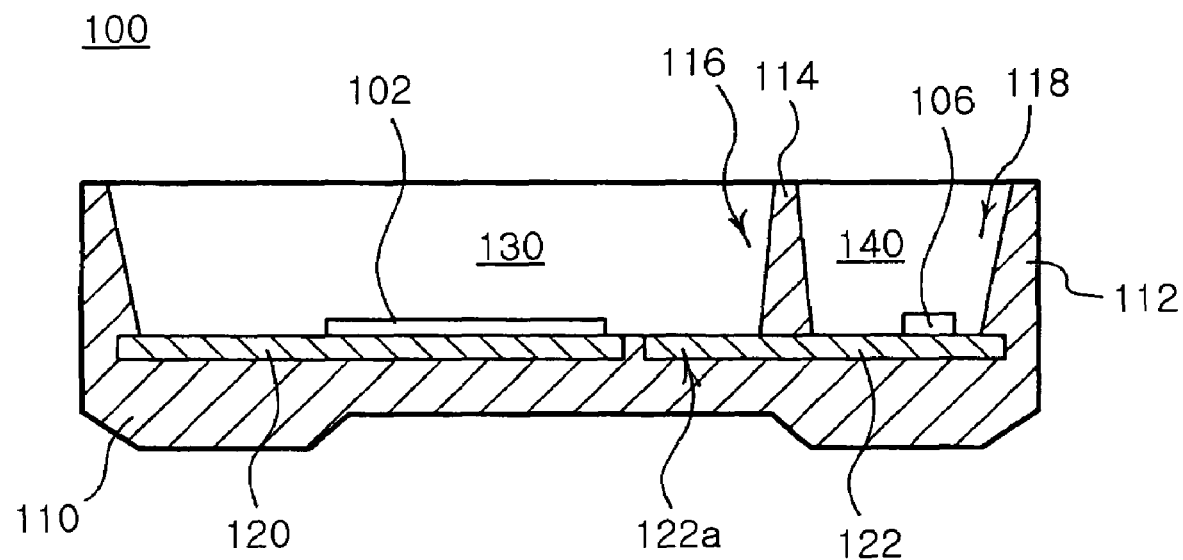
FIG. 6 is a cross-sectional view cut along the line 6-6 of FIG. 5.
Figure 7:
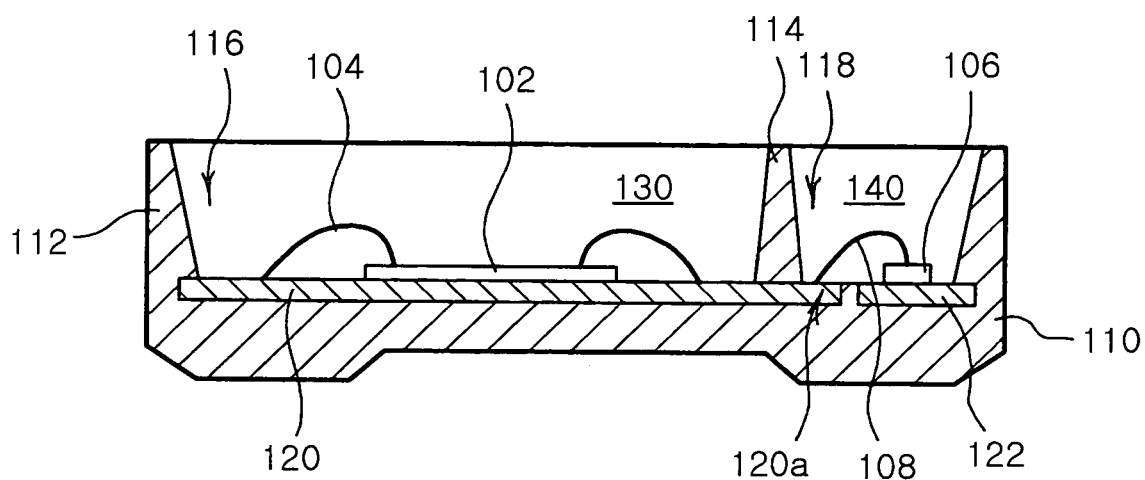
FIG. 7 is a cross-sectional view cut along the line 7-7 of FIG. 5.

First, a side view light emitting diode (LED) of the invention will be explained with reference to FIGS. 4 to 7, in which FIG. 4 is a perspective view illustrating the side view LED of the invention, FIG. 5 is a front elevation view illustrating the side view LED of FIG. 4 seen along an arrow A direction, FIG. 6 is a cross-sectional view cut along the line 6-6 of FIG. 5, and FIG. 7 is a cross-sectional view cut along the line 7-7 of FIG. 5.

The side view LED 100 of the invention includes a package body 110, first and second lead frames 120 and 122, an LED chip 102, a protective device 106, a first encapsulant 130 and a second encapsulant 140. The package body 110 has first and second opened areas 116 and 118 formed therein. The first and second lead frames are housed by the package body 110. The LED chip 102 is disposed in the first opened area 116. Also, the protective device 106 is disposed in the second opened area 118. The first encapsulant 130 is provided to the first opened area 116 to encapsulate the LED chip 102. The second encapsulant 140 is provided to the second opened area 118 to encapsulate the protective device 106.

The package body 110 has a wall part 112 and a partition wall 114 for surrounding and delineating the first and second opened areas 116 and 118. Here, the wall part 112 and the partition wall 114 are of the same height. The first opened area 116 is shaped long and narrow to have the LED chip 102 mounted therein. Also, the first opened area 116 is shaped such that light generated from the LED chip 102 can be emitted in a single direction. Furthermore, the second opened area 118 is generally shaped as a square to have the protective device 106 mounted therein. The package body 110 is typically made of an opaque resin, and preferably a high reflectivity resin. Alternatively, the package body 110 is made of a transparent material and inner walls of the opened areas 116 and 118 are coated with an opaque or high reflectivity material.

The first and second lead frames 120 and 122 are made of a high conductivity and high reflectivity metal. The first lead frame 120, which is an elongated member, acts as a terminal and has a finger 120a extending therefrom. Likewise, the second lead frame 122, which is an elongated member, also acts a terminal and has a finger 122a extending therefrom. The first and second lead frames 120 and 122 are disposed next to each other at a predetermined gap along a length direction. The finger 120a of the first frame 120 is disposed in parallel with the finger 122a of the second frame 122.

In addition, the first lead frame 120 is mostly disposed in the first opened area 116 so that the LED chip 102 can be mounted thereon. Moreover, the finger 120a thereof extends through the partition wall 114 into the second opened area 118. Likewise, the second lead frame 122 is mostly disposed in the second opened area 118 so that the protective device 106 can be mounted thereon. The finger 122a thereof extends through the partition wall 14 into the first opened area 116. In this fashion, the finger 120a of the first lead frame 120 and the finger 122a of the second lead frame 122 are disposed in parallel at a predetermined gap, extending across the partition wall 114.

The LED chip 102 is electrically connected to the first lead frame 120 and the finger 122a of the second lead frame 122 via a pair of wires 104. Alternatively, the LED chip 102 has an electrode formed on an underside thereof and directly connected to the first lead frame 120 via a solder bump. The protective device 106 has an electrode in a direct contact with the second lead frame 122 and electrically connected thereto. Also, the protective device 106 has the other electrode electrically connected to the finger 120a of the first lead frame via the wire. Of course, in the same manner as the LED chip 102 but not typically, the protective device 106 may be electrically connected to the finger 120a of the first lead frame 120 and the second lead frame 122 via a pair of wires.

In this fashion, the protective device 106 is connected in parallel to the LED chip 102, which is thereby protected from electrical abnormality, i.e., static electricity, inverse voltage and over voltage. Meanwhile, the protective device 106 is exemplified by a voltage regulation diode such as a Zener diode.

A transparent encapsulant 130 in the first opened area 116 protects the LED chip 102. The transparent encapsulant 130 is made of various kinds of transparent resins. For example, the transparent encapsulant 130 is made of epoxy or silicone, and may contain an ultraviolet absorbent for absorbing ultraviolet ray generated by the LED chip 102 or a fluorescent material for converting short wavelength light into white light.

The encapsulant 140 in the second opened area 118 encapsulates the protective device 106. Unlike the transparent encapsulant 130 just described, materials for the encapsulant 140 are not limited.

This allows the protective device 106 to be connected to the LED chip 102 in parallel, thereby protecting the LED chip 102 from electrical abnormality such as static electricity, inverse voltage and over voltage. Also, an LED window is formed separate from the protective device 106, around the LED chip 102 by the partition wall 114 so that light from the LED chip 102 is not absorbed by the protective device 106. This enhances light emitting efficiency of the LED 100.

Further, the finger 120a of the first lead frame 120 extends from the first opened area 116 through the partition wall 114 to the second opened area, and is thereby electrically connected to the protective device 106. This allows a wire of the protective device 106 to be electrically connected to the first lead frame 120 without going over the partition wall 114. Likewise, the finger 122a of the second lead frame 122 extends from the second opened area 118 through the partition wall 114 to the first opened area 118, thereby electrically connected to the LED chip 102. This also allows a wire 104 of the LED chip 102 to be electrically connected to the second lead frame 122 without going over the partition wall 14.

A side view LED according to further another embodiment of the invention will be explained hereunder with reference to FIG. 8, which is a cross-sectional view illustrating the side view LED according to further another embodiment of the invention, corresponding to FIG. 7.

Figure 8:
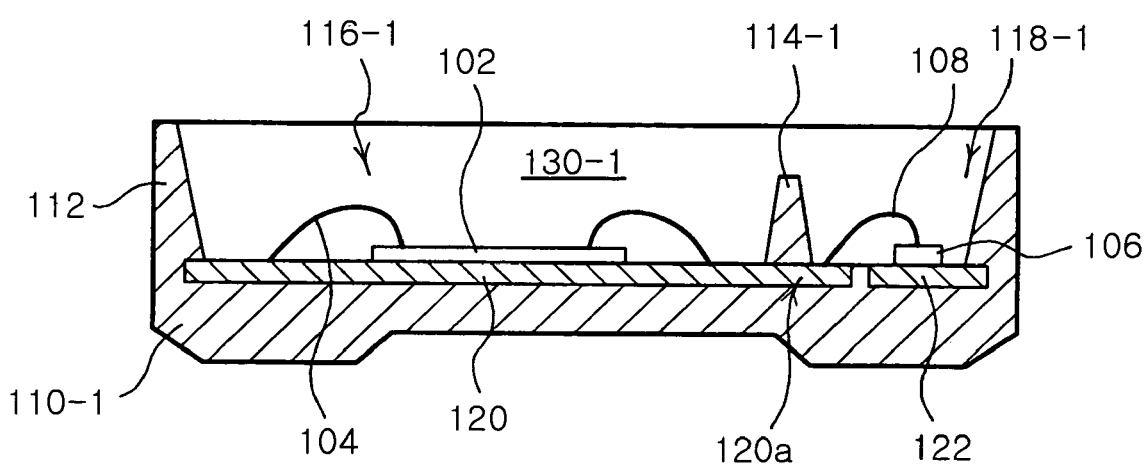
FIG. 8 is a cross-sectional view illustrating a side view LED according to another embodiment of the invention, corresponding to FIG. 7.

Referring to FIG. 8, the side view LED 100-1 according to the invention is substantially identical to the aforesaid side view LED 100 except that in the side view LED 100-1 of FIG. 8, a partition wall 114-1 is formed lower than a sidewall 112. Therefore, the same or corresponding components were given the same reference signs and will not be explained further.

With the partition wall 114-1 disposed lower than the sidewall 112, first and second opened areas of the partition wall 114-1 are connected into one. Resin, when provided to the opened areas 116-1 and 118-1, forms into an encapsulant 130-1. Accordingly, a distal end of the partition wall 114-1 is disposed below the head or top surface of the encapsulant 130-1.

This structure has additional advantages as stated below. To form the partition wall 114-1 at the same height as the sidewall, resin should migrate smoothly from the sidewall 112 or toward the partition wall 114-1 through a gap between the first and second lead frames 120 and 122. But given fluidity of resin, the resin may be restricted from migrating and a void may occur on the distal end of the partition wall 114-1. Therefore, the partition wall 114-1, if lowered, can prevent void formation on the distal end of the sidewall 114-1 despite some restriction in resin migration.

Figure 9:
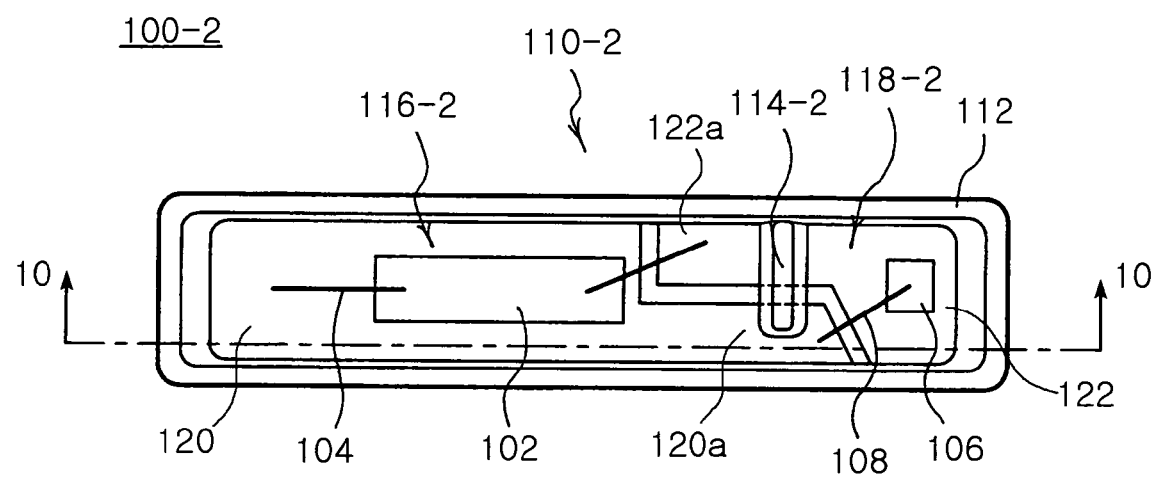
FIG. 9 is a front elevation view illustrating a modified example of a side view light emitting diode according to further another embodiment of the invention.
Figure 10:
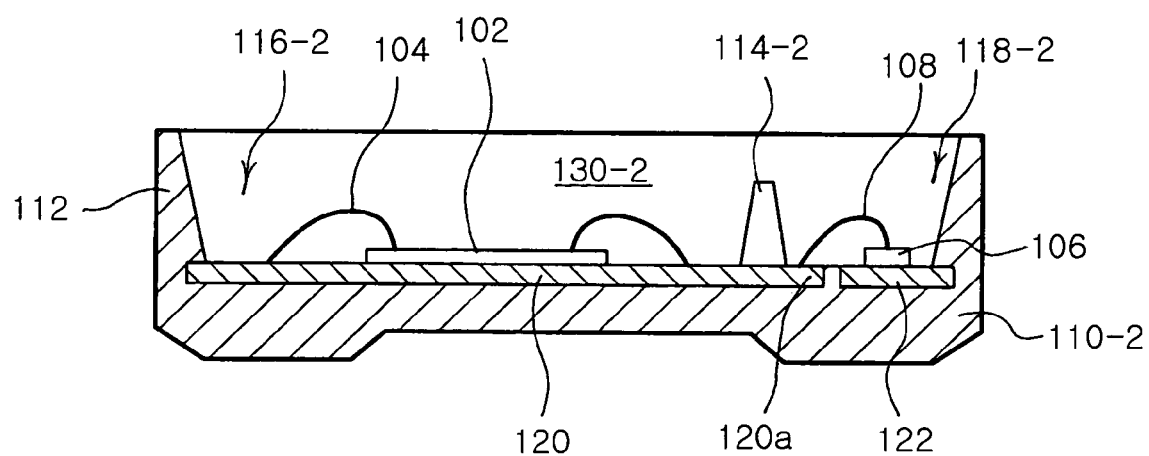
FIG. 10 is a cross-sectional view cut along the line 10-10 of FIG. 9.

A side view LED according to further another embodiment of the invention will be explained with reference to FIGS. 9 and 10, in which FIG. 9 is a front evaluation view illustrating another modified example of the side view LED according to further another embodiment of the invention and FIG. 10 is a cross-sectional view cut along the line 10-10 of FIG. 9.

Referring to FIGS. 9 and 10, the side view LED 100-2 is substantially identical to the aforesaid side view LED 100 except that in the side view LED 100-2, a partition wall 114-2 is formed lower than a sidewall 112, and a lower end of the partition wall 114-2 is not extended to the sidewall 112. Therefore, the same or corresponding components were given the same reference signs and will not be explained further.

In this fashion, the partition wall 114-2 is formed lower than the sidewall 112 and a portion of the partition wall 114-2 is separated from the sidewall 112 so that first and second areas 116-2 and 118-2 disposed at both sides of the partition wall 114-2 are connected into one. Also, resin, when provided to the opened areas 116-2 and 118-2 forms into an encapsulant 130-2. This allows a distal end of the partition wall 114-2 to be disposed below the encapsulant 130-2.

This structure has additional advantages as stated below. To form the partition wall 114-2 at the same height as the sidewall, resin should migrate smoothly from the sidewall 112 or toward the partition wall 114-2 through the first and second lead frames 120 and 122. But given fluidity of resin, the resin is restricted from migrating and a void may occur on the distal end of the partition wall 114-2. Therefore, the partition wall 114-2 is reduced in its height and narrowed in its width to prevent void formation on the distal end of the partition wall 114-2 despite some restriction in resin migration.

Meanwhile, a lower end of the partition wall 114-2 is separated from the sidewall 112 as shown in FIG. 9, but an upper end thereof may be separated from the sidewall 112. Of course, the upper and lower ends of the partition wall 114-2 may be separated from the sidewall 114-2. Alternatively, the partition wall 114-2 may have at least one portion thereof separated from the sidewall 112 and a distal end thereof formed at the same height as the sidewall 112.

As set forth above, according to preferred embodiments of the invention, a protective device is connected to an LED chip in parallel, thereby protecting the LED chip from electrical abnormality such as over voltage, inverse voltage and static electricity. Also, an LED window is formed separate from a protective device, around the LED chip by the partition wall so that light from the LED chip is not absorbed by the protective device. This enhances light emitting efficiency of the LED.

In addition, a finger of a first lead frame extends from a first opened area through a partition wall to a second opened area, thereby electrically connected to a protective device. This allows a wire of the protective device to be electrically connected to the first lead frame without going over the partition wall. Likewise, a finger of the second lead frame extends from the second opened area through the partition wall to the first opened area, thereby electrically connected to the LED chip. This also allows the wire of the LED chip to be electrically connected to the second lead frame without going over the partition wall. This prevents an increase in the LED size potentially caused by the wire going over the partition wall.

While the present invention has been shown and described in connection with the preferred embodiments, it will be apparent to those skilled in the art that modifications and variations can be made without departing from the spirit and scope of the invention as defined by the appended claims.

What is claimed is:

1. A side view light emitting diode comprising:
   an elongated first lead frame having a finger extending therefrom;
   an elongated second lead frame with a narrow width and a long length having a finger disposed in parallel with the finger of the first lead frame, the second lead frame disposed next to the first lead frame at a predetermined gap along a length direction;

a light emitting diode chip mounted on a mounting area of the first lead frame and electrically connected to the first and second lead frames;

a protective device mounted on a mounting area of the second lead frame in parallel with the light emitting diode chip and electrically connected to the first and second lead frames to protect the light emitting diode chip from electrical abnormality, the mounting area of the second lead frame facing the same direction as the mounting area of the first lead frame;

a package body housing the first and second lead frames to form a first opened area externally opened around the light emitting diode chip and a second opened area externally opened around the protective device, the package body having a partition wall formed across the fingers of the first and second lead frames and between the first and second opened areas to block light from the light emitting diode chip from entering the second opened area; and a first encapsulant provided to the first opened area of the package body to protect the LED chip; a second encapsulant provided to the second opened area of the package body to protect the protective device, wherein at least the first encapsulant is transparent.

2. The side view light emitting diode according to claim 1, wherein a distal end of the partition wall is coplanar with an outer surface of the transparent first encapuslant.

3. The side view light emitting diode according to claim 2, wherein the second encapsulant is separate from the first encapsulant.

4. The side view light emitting diode according to claim 3, wherein the second encapsulant comprises one selected from a group consisting of a transparent material, a semitransparent material and an opaque material.

5. The side view light emitting diode according to claim 1, wherein the partition wall partially separates the first opened area from the second opened area.

6. The side view light emitting diode according to claim 5, wherein a distal end of the partition wall is disposed below an outer surface of the transparent encapsulant.

7. The side view light emitting diode according to claim 5, wherein a portion of the partition wall is separated from a sidewall of the package body surrounding the first and second opened areas.

8. The side view light emitting diode according to claim 5, wherein the first and second encapsulants are integrally formed of a transparent material.

9. The side view light emitting diode according to claim 5, wherein the transparent encapsulant contains an ultraviolet ray absorbent or a fluorescent material for converting short-wavelength light into multi-wavelength light.

10. The side view light emitting diode according to claim 1, wherein the transparent first encapsulant contains an ultraviolet absorbent or a fluorescent material for converting short-wavelength light into multi-wavelength light.

* * * * *